United States Patent
Maderbacher et al.

(10) Patent No.: US 9,595,922 B2
(45) Date of Patent: Mar. 14, 2017

(54) CHOPPER AMPLIFIER

(71) Applicant: Infineon Technologies AG, Neubiberg (DE)

(72) Inventors: Gerhard Maderbacher, Gleisdorf (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 373 days.

(21) Appl. No.: 13/680,135

(22) Filed: Nov. 19, 2012

(65) Prior Publication Data
US 2014/0139285 A1    May 22, 2014

(51) Int. Cl.
| | |
|---|---|
| H03F 1/26 | (2006.01) |
| H03F 3/393 | (2006.01) |
| H03F 3/387 | (2006.01) |
| H03F 3/45 | (2006.01) |
| H03F 3/00 | (2006.01) |

(52) U.S. Cl.
CPC ............. *H03F 1/26* (2013.01); *H03F 3/387* (2013.01); *H03F 3/393* (2013.01); *H03F 3/45968* (2013.01); *H03F 3/005* (2013.01); *H03F 2200/231* (2013.01); *H03F 2200/459* (2013.01)

(58) Field of Classification Search
CPC ............. H03F 3/45475; H03F 3/45968; H03F 2200/372; H03F 2203/45212; H03F 3/45744; H03F 2200/153; H03F 3/38; H03F 1/32; H03F 2200/78; H03F 3/217; H03F 3/45977; H03F 3/45995; H03F 1/303; H03F 3/005; H03F 3/387; H03F 1/0261; H03F 1/30; H03F 1/302; H03C 1/06; H03C 2200/00; H03G 3/3042; H03G 3/3047

USPC ...................... 330/9; 327/124, 307
See application file for complete search history.

(56) References Cited

U.S. PATENT DOCUMENTS

| | | | |
|---|---|---|---|
| 6,130,578 A | 10/2000 | Tang | |
| 6,262,626 B1 * | 7/2001 | Bakker et al. | 330/9 |
| 6,437,717 B1 * | 8/2002 | Van der Ploeg et al. | 341/118 |
| 6,826,388 B1 * | 11/2004 | Tanaka et al. | 455/77 |
| 6,911,864 B2 * | 6/2005 | Bakker et al. | 330/69 |
| 7,492,149 B2 | 2/2009 | Motz et al. | |
| 7,683,701 B2 | 3/2010 | Georgescu et al. | |
| 7,764,118 B2 * | 7/2010 | Kusuda et al. | 327/124 |

(Continued)

FOREIGN PATENT DOCUMENTS

DE     102009019949 A1    11/2009

OTHER PUBLICATIONS

A current-feedback instrumentation amplifier with a gain error reduction loop and 0.06% untrimmed gain error , Rong Wu; Huijsing, J.H.; Makinwa, K.A.A., Solid-State Circuits Conference Digest of Technical Papers (ISSCC), 2011 IEEE International, Feb. 22, 2011, pp. 244-246.

(Continued)

*Primary Examiner* — Khanh V Nguyen
(74) *Attorney, Agent, or Firm* — Shumaker & Sieffert, P.A.

(57) ABSTRACT

Various apparatuses and methods are described where a signal is amplified using a chopper amplifier arrangement, and ripples caused by said chopper amplifier arrangement are reduced. In some cases, this reduction of ripples is performed by controlling a voltage offset of an amplifier of said chopper amplifier arrangement. In other embodiments, a detection of ripples or a chopping of the chopper amplifier arrangement is at least temporarily disabled.

24 Claims, 4 Drawing Sheets

(56) References Cited

U.S. PATENT DOCUMENTS

| | | |
|---|---|---|
| 8,004,444 B2 | 8/2011 | Balachandran |
| 8,120,422 B1 | 2/2012 | Huijsing et al. |
| 8,154,281 B2 | 4/2012 | Motz |
| 8,179,195 B1 * | 5/2012 | Huijsing et al. .................. 330/9 |
| 8,203,471 B2 * | 6/2012 | Motz et al. .................. 341/110 |
| 8,638,166 B2 * | 1/2014 | Ahmad ............................ 330/9 |
| 8,829,988 B2 * | 9/2014 | Motz et al. ....................... 330/9 |
| 2006/0244520 A1 * | 11/2006 | Wang ................................ 330/9 |
| 2011/0215955 A1 | 9/2011 | Motz et al. |
| 2012/0194179 A1 | 8/2012 | Motz |
| 2013/0335141 A1 * | 12/2013 | Ahmad .......................... 330/69 |

OTHER PUBLICATIONS

A Current-Feedback Instrumentation Amplifier With a Gain Error Reduction Loop and 0.06% Untrimmed Gain Error, Rong Wu; Huijsing, J.H.; Makinwa, K.A.A., IEEE Journal of Solid-State Circuits, vol. 46, No. 12, Dec. 2011, pp. 2794-2806.

* cited by examiner

CHOPPER AMPLIFIER

FIELD OF THE INVENTION

The present application relates to chopper amplifiers, apparatuses comprising chopper amplifiers and to corresponding methods.

BACKGROUND OF THE INVENTION

Chopper amplifiers, also referred to as chopper amplifier arrangements in the following, are a type of amplifiers where a signal to be amplified is modulated (chopped), amplified and demodulated again. By employing such a technique, switching noise may be shifted to a frequency band which is not of interest, and so-called 1/f noise may be reduced. Such chopper amplifiers may for example be employed in bandgap circuits which provide a defined reference voltage, but also may be used in other applications where a signal is to be amplified.

This modulation and demodulation, also referred to as chopping, however, introduces ripples into the output signal. Such ripples may for example be caused by a voltage offset of an amplifier used for amplification within the chopper amplifier.

Various techniques have been employed to reduce such ripples. However, at least in some cases, such conventional techniques are comparatively costly to implement, are disadvantageous in terms of power consumption or are fixed to a specific chopper frequency.

BRIEF DESCRIPTION OF THE DRAWINGS

Illustrative embodiments will be described with reference to the attached drawings, wherein.

DETAILED DESCRIPTION

Embodiments of various implementations will now be described in detail with reference to the attached drawings. It should be noted that these embodiments are given only for illustration purposes and are not to be construed as limiting the scope of the present application.

Features of different embodiments described in the following or shown in the drawings may be combined with each other unless specifically noted otherwise. Also, a modification or variation described with respect to one of the embodiments is also applicable to other embodiments unless noted to the contrary.

Various elements shown in the drawings are not necessary to scale with each other, and the spatial arrangement of the various elements in various implementations may be different to the shown spatial arrangement. Elements shown in the drawings may be replaced by other elements performing essentially the same function without departing from the scope of the present application.

In some embodiments, a chopper amplifier arrangement is used to amplify a signal. The chopper amplifier arrangement may include a modulator, an amplifier and a demodulator. In some embodiments, ripples caused by the chopper amplifier arrangement are detected, and a voltage offset of the amplifier is adjusted based on the detected ripples.

In some embodiments, ripples caused by a chopper amplifier arrangement are reduced. Once the ripple is reduced, at least part of the circuit used for reducing the ripple and/or a chopping, i.e. modulation and demodulation, of the chopper amplifier arrangement may be deactivated, for example temporarily deactivated for a predetermined period of time. The at least part of the ripple reduction circuit and/or the chopping may be reactivated after the predetermined time and e.g. then deactivated again.

Figure 1:
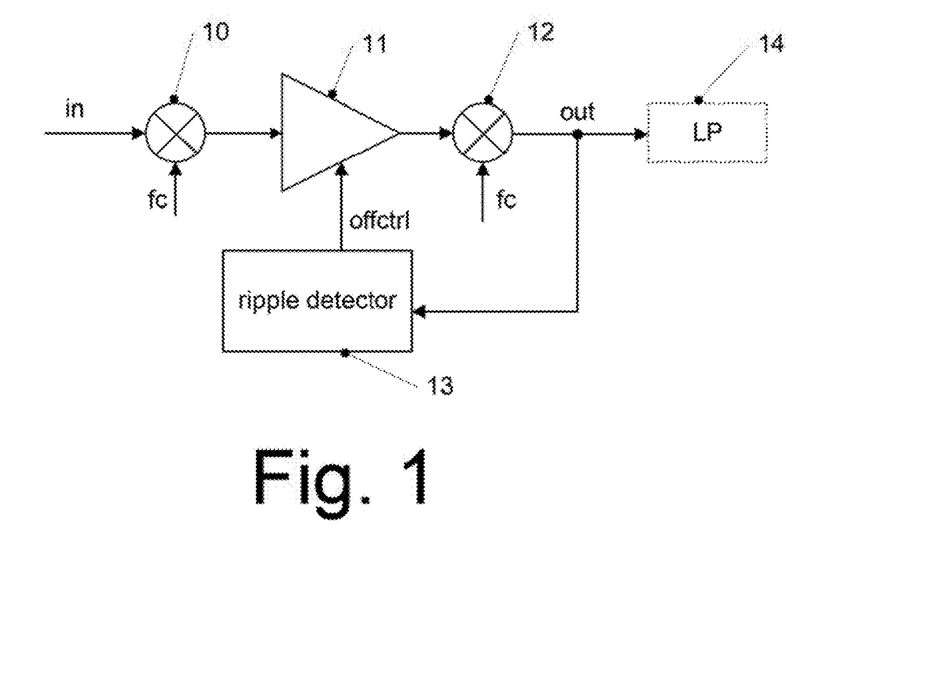
FIG. 1 is a schematic diagram of an apparatus according to an embodiment.

Turning now to the figures, in FIG. 1 an apparatus according to an embodiment is schematically shown.

The apparatus of FIG. 1 includes an amplifier arrangement, which may be a chopper amplifier arrangement in one example. The chopper amplifier arrangement may include a modulator 10, an amplifier 11 downstream of modulator 10 and a demodulator 12 downstream of amplifier 11. A first device being placed "downstream" of a second device in the context of this application indicates that during operation the first device receives signals output by the second device, either directly or indirectly via intervening devices which may modify the signals. Modulator 10 and Demodulator 12 may be implemented as mixers. Modulator 10 modulates (chops) an input signal in with a frequency fc, also referred to as chopper frequency fc. Amplifier 11 amplifies the modulated signal to form an amplified signal, and demodulator 12 demodulates the amplified signal based on the chopper frequency fc to form an output signal out. The term amplifier as used herein refers to any type of conventional amplifier or circuit or unit comprising an amplifier, including devices which amplify only signals having specific features. For example, some types of integrators amplify signals having specific frequencies and are also to be regarded as amplifiers. Such integrators may comprise an operational amplifier or similar device which, instead of having only resistors in feedback paths from output to input as in some conventional amplifiers, has one or more of such resistors replaced by a capacitor. All such devices are to regarded as amplifier as used herein.

Furthermore, the apparatus of FIG. 1 may include a ripple detector 13 which detects ripples caused by the chopper amplifier arrangement. In the example of FIG. 1, ripple detector 13 detects the ripples based on the output signal out. In other embodiments, other signals may be additionally or alternatively used as a basis for the ripple detection. For example in some cases, through a feedback loop or the like output signal out may also influence the input signal in, and thus ripples in the output signal out may cause ripples in the input signal in and/or in other signals present in the apparatus, for example in the modulated signal output by modulator 10 or the amplified signal output by amplifier 11. In such a case, any of these signals may be used as a basis for the ripple detection. In other embodiments, the output signal out may be modified by further circuits, components or systems before being fed to ripple detector 13. Such further circuits, components or systems may for example comprise amplifiers, filters, analog to digital converters or digital to analog converters. In other embodiments, a signal within the chopper amplifier arrangement may be used as a basis for the ripple detection, for example a signal tapped between amplifier 11 and demodulator 12.

In some embodiments, which will be described later in more detail, the signal which is used for ripple detection, for example output signal out in FIG. 1, is digitized by an analog to digital converter, for example a 1 bit analog to digital converter (ADC) like a simple comparator. For example, in this way a polarity of ripples may be detected. Instead of a 1-bit analog to digital converter, also other types of converters, for example SAR (Successive Approximation Register)-ADCs, flash ADCs, tracking ADCs or others may be used. Some of those ADCs require the use of a digital to analog converter in a feed back path. For such a digital to analog converter, also various types may be used, like current steering digital to analog converters (DACs), sigma-delta DACs, voltage DACs or switched capacitor DACs. As suitable comparators, also for example Auto-zero comparators or correlated double-sampling comparators may be used, which auto-compensate or otherwise reduce or remove any offset introduced by the comparator used. In response to the ripples detected, ripple detector 13 outputs a signal offctrl to control a voltage offset of amplifier 11, for example by feeding the signal offctrl to a corresponding offset voltage control terminal of amplifier 11. In particular, in this way in some embodiments the voltage offset may be regulated to reduce, minimize or even remove the ripples. In case of the ripple detector 13 including an ADC, the digitized signal, for example 1 bit signal indicating a polarity of the ripples, may be integrated to form the control signal offctrl. In case of a digitized signal indicating a polarity of the ripples, in some embodiments the integrator may comprise a simple up/down counter which for example may count up in case of a positive polarity being detected and count down in case of a negative polarity being detected. In other embodiments, an adaptive digital integrator may be used which for example may adapt an integrator step size depending on a previous behavior of the digitized signal. For example, in case the digitized signal indicates large ripples, a larger step size may be used than in case of small ripples.

Therefore, in the embodiment of FIG. 1, an efficient reduction of ripples may be provided.

In various embodiments, a lowpass filter for reducing ripples in the output signal out may not be needed. Nevertheless, in order to further reduce ripples and to further smooth output signal out, optionally a lowpass filter 14 may be provided, which may be made smaller and therefore implemented more cheaply than in conventional solutions, as the ripples may already be reduced without the lowpass filter and thus less filtering is needed than in conventional solutions.

Figure 2:
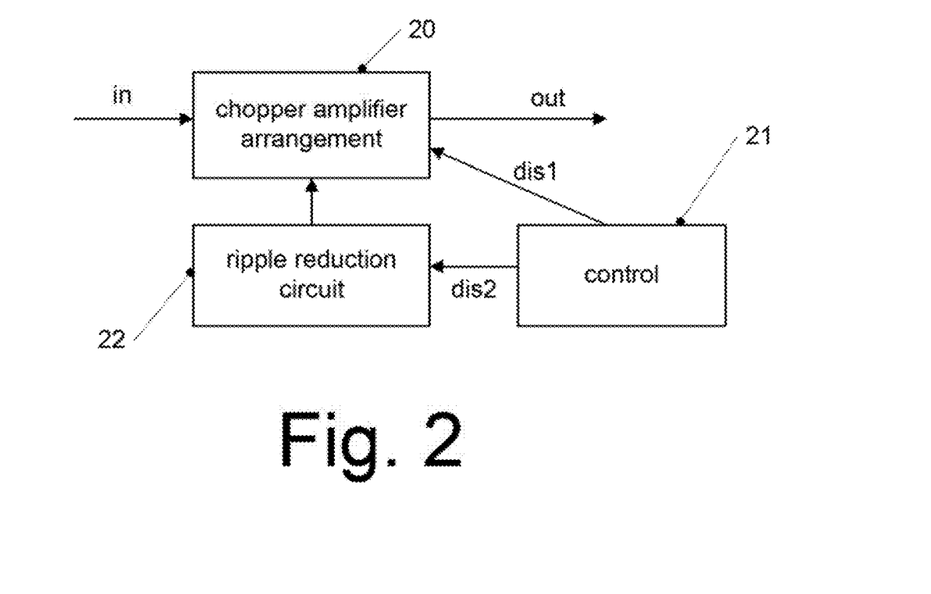
FIG. 2 is a block diagram of an apparatus according to an embodiment.

In FIG. 2, an apparatus according to a further embodiment is shown. The embodiment of FIG. 2 includes a chopper amplifier arrangement 20 receiving an input signal in and outputting an output signal out. Chopper amplifier arrangement 20 may include a modulator, an amplifier and a demodulator as explained for example with reference to FIG. 1.

Furthermore, the embodiment of FIG. 2 includes a ripple reduction circuit 22 serving to reduce ripples in the output signal out, for example by controlling chopper amplifier arrangement 20 accordingly. Ripple reduction circuit 22 may in particular control an offset of an amplifier of chopper amplifier arrangement 20, as explained for example with respect to FIG. 1. However, other kinds of ripple reduction circuits may also be used in other embodiments. Furthermore, the embodiment of FIG. 2 includes a control 21 which may disable a chopping of chopper amplifier arrangement 20 using a disable signal dis1 and/or disable ripple reduction circuit 22 or parts thereof using a disable signal dis2. For example, once ripples are reduced, a chopping of chopper amplifier arrangement 20 may be temporarily disabled using signal dis1, and/or at least part of ripple reduction circuit 22, for example an analog to digital converter thereof, may be temporarily disabled using signal dis2. For example, in some embodiments such a disabling may be performed once ripples are reduced below a predetermined threshold. In other embodiments, the disabling may for example by performed once ripple reduction circuit 22 has settled, for example when a polarity of ripples detected toggles, i.e. the ripples alternately having positive and negative polarity.

In some embodiments, after a predetermined period of time the chopping and/or the portions of ripple reduction circuit 22 may be enabled again, for example to again reduce ripples which reappeared in the meantime, for example due to temperature variations or other variations. Disabling the chopping may for example include disabling modulator 10 of FIG. 1, demodulator 12 of FIG. 1 or both, for example by replacing chopper frequency fc by a constant signal.

It should be noted that the embodiments of FIGS. 1 and 2 may be combined with each other. In particular, ripple reduction circuit 22 of FIG. 2 may include a ripple detector like ripple detector 13 of FIG. 1.

Figure 3:
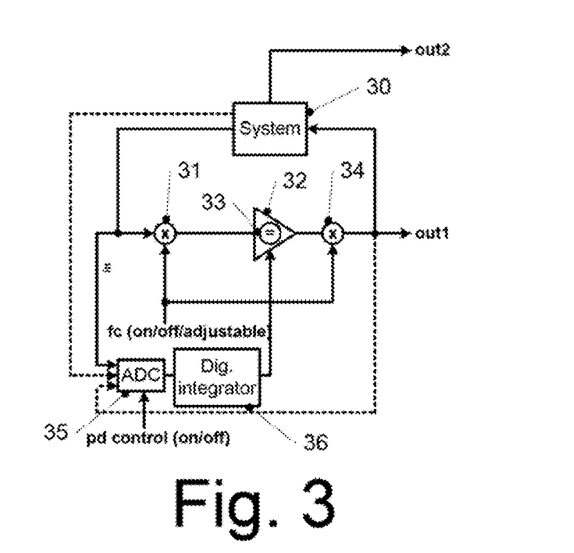
FIG. 3 is a block diagram of an apparatus according to an embodiment.

In FIG. 3, a further embodiment of an apparatus according to an embodiment is shown.

The embodiment of FIG. 3 includes a system 30 an output signal of which is to be amplified by a chopper amplifier arrangement and/or which is to be controlled based on an output signal of a chopper amplifier arrangement. More specifically, the embodiment of FIG. 3 includes a chopper amplifier arrangement comprising a modulator 31, an amplifier 32 downstream of modulator 31 and a demodulator 34 downstream of amplifier 32. In some embodiments, system 30 may include a bandgap circuit to provide a reference voltage. In other embodiments, system 30 may be any other system an output signal of which is to be amplified, for example a system outputting audio signals which are to be amplified by the chopper amplifier arrangement.

Figure 4:
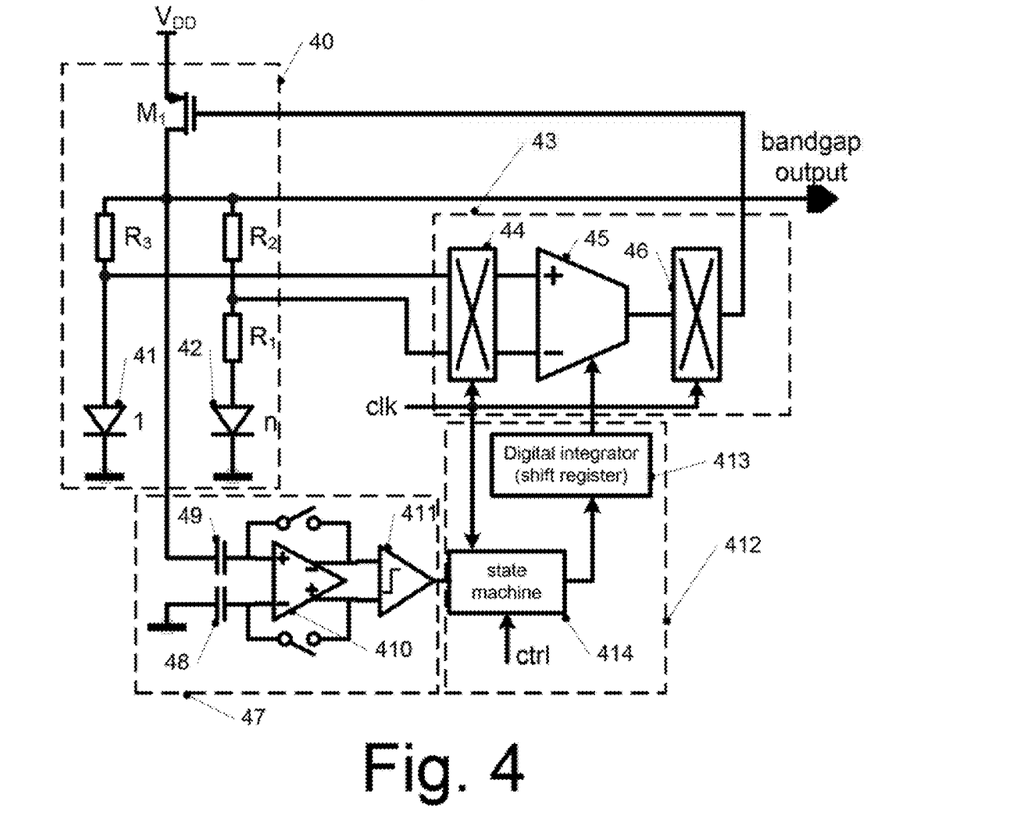
FIG. 4 is a circuit diagram of an apparatus according to an embodiment.

Modulator 31 and demodulator 34 may for example be implemented as mixers controlled by a chopper frequency fc, which in the embodiment of FIG. 4 may be adjustable or may be turned on and off. In other embodiments, frequency fc may be a fixed frequency which is always turned on. In the embodiment of FIG. 3, the chopper frequency fc may for example be adjusted to adjust a knee point of flicker noise during operation.

In the apparatus of FIG. 3, an output signal of demodulator 34 is designated out1 and, besides being output, is fed back to system 30. An output signal of system 30 is labeled out2. In some embodiments, output signal out1 may influence output signal out2, for example determining a signal strength thereof, for example by regulating a voltage and/or current of the output signal out2.

A further output signal of system 30 is fed to modulator 31 as an input signal in.

Through the feedback of output signal out1 to system 30, ripples which may be caused by a voltage offset 33 of amplifier 32 may occur not only in output signal out1, but also in input signal in or in output signal out2.

In order to detect ripples, in the apparatus of FIG. 3 an analog to digital converter 35 is provided which receives input signals in. In other embodiments, additionally or alternatively analog to digital converter 35 may receive output signal out1 or a signal output by system 30 like out2, as indicated by dashed lines in FIG. 3.

In some embodiments, analog to digital converter 35 may include a comparator thus forming a 1 bit analog to digital converter, for example to detect a polarity of ripples in input signal in or in any other signal fed to analog to digital converter 35.

An output of analog to digital converter 35 is fed to an input of a digital integrator 36. Digital integrator 36 integrates the digitized signal to form a control signal controlling, in particular adjusting voltage offset 33 of amplifier 32. For example, in a case where analog to digital converter 35 detects a polarity of ripples, digital integrator 36 through integration may for example increase the control signal in case of a first polarity of ripples and decrease the control signal in case of a second polarity of ripples, to thus adjust the voltage offset in a way to reduce or minimize ripples.

In the embodiment of FIG. 3, amplifier 32 is an amplifier with adjustable voltage offset which is adjusted via a corresponding control input. In other embodiments, for example a controllable voltage source may be provided to supply an additional voltage compensating a voltage offset of an amplifier.

In the embodiment of FIG. 3, the chopping frequency fc may be adjustable. In some cases, after ripple has been reduced sufficiently, the chopping frequency fc may even be turned off such that no chopping occurs. Likewise, when ripple has been reduced sufficiently, for example analog to digital converter 35 may be turned off such that the signal output by digital integrator 36 remains constant. After a predetermined time, these elements may be turned on again to again reduce ripples which may have reappeared in the meantime for example due to temperature or other variations.

It should be noted that in some cases, it may also be desirable to continue chopping to continue reducing 1/f noise. In such cases, for example analog to digital converter 35 may be turned off in order to reduce power consumption. In other embodiments, all components of the embodiment of FIG. 3 may remain turned on continuously.

FIG. 4 shows a circuit diagram of an apparatus according to an embodiment. The apparatus of FIG. 4 includes a bandgap circuit 40 and a chopper amplifier arrangement 43. Bandgap circuit 40 is an example for a system which may be used in conjunction with a chopper amplifier arrangement like chopper amplifier arrangement 43. While a specific implementation of a bandgap circuit is shown, a suitable bandgap circuit may be implemented in any conventional manner.

Bandgap circuit 40 of the apparatus of FIG. 4 includes a first diode 41 and a second diode 42. Second diode 42 may be scaled with respect to first diode 41 by a scaling factor of n. First diode 41 and second diode 42 may be implemented as pn junctions, or also as field effect transistors like MOSFETs operated as diodes.

One terminal of first diode 41 is coupled to ground (or a supply voltage like $V_{SS}$), and a second terminal of first diode 41 is coupled to a first terminal of a resistor $R_3$. A node between first diode 41 and resistor $R_3$ is coupled to a first input of chopper amplifier arrangement 43 as shown. A first terminal of second diode 42 is coupled to ground (or another supply voltage like $V_{SS}$), and a second terminal of second diode 42 is coupled to a first terminal of resistor $R_1$. A second terminal of resistor $R_1$ is coupled to a first terminal of a resistor $R_2$. A node between resistors $R_1$ and $R_2$ is coupled to a second input of chopper amplifier arrangement 43. In some embodiments, $R_3$ may have a resistance value which corresponds to the resistance value of $R_2$ divided by m, i.e. $R_3=R_2/m$.

Second terminals of resistors $R_2$ and $R_3$ are coupled to an output labeled "bandgap output" in FIG. 4 where a bandgap reference voltage may be tapped. Furthermore, second terminals of resistors $R_2$ and $R_3$ are coupled to a reference voltage $V_{DD}$ via a transistor $M_1$, in the case of FIG. 4 a MOS transistor. A gate, i.e. a control input, of transistor $M_1$ is coupled to an output of chopper amplifier 43. Therefore, the output of chopper amplifier 43 determines a current flowing via transistor $M_1$ and/or a voltage drop over transistor $M_1$ and therefore influences the bandgap reference voltage to be tapped at the bandgap output. In other words, in FIG. 4 an output of demodulator 46 is coupled to a control input of bandgap circuit 40 acting as an example for the system in FIG. 4.

Chopper amplifier arrangement 43 in the embodiment of FIG. 4 includes a differential modulator 44 which modulates the signals received from bandgap circuit 40 according to a clock signal clk having a corresponding chopper frequency and feeds the thus modulated signals to differential inputs of a difference amplifier 45. Difference amplifier 45 amplifies the difference between the modulated signals received and outputs an amplified signal to a demodulator 46 which demodulates the signals based on the clock signal clk and feeds the demodulated signal as already explained to a gate terminal of transistor $M_1$.

Furthermore, the apparatus includes an analog to digital converter arrangement 47, in this case a comparator acting as a 1-bit analog to digital converter, to detect ripples caused by chopper amplifier arrangement 48. In the apparatus of FIG. 4, the output signal also output at the bandgap output is fed to analog to digital converter arrangement 47. Via transistor $M_1$, this signal is influenced by the output signal of chopper amplifier arrangement 43 and therefore exhibits ripples corresponding to ripples in the output signal of chopper amplifier arrangement 43. In other embodiments, for example the output signal of chopper amplifier arrangement 43 may be fed to analog to digital converter arrangement 47.

Comparator arrangement 47 includes a comparator 410. A first input of comparator 410 is coupled via a capacitance 49 with the bandgap output, and a second input of comparator 410 is coupled via a capacitance 48 with ground. Capacitances 48, 49 serve to reject a DC (Direct Current) component of the signals. Comparator 410 is followed by a Schmitt-trigger or other kind of slicer 411 which converts the differential output of comparator 410 to a single ended signal. Element 411 therefore outputs a signal with two possible states, i.e. a 1-bit digital signal. To provide this signal with a signal clock, for example switches coupled between inputs and outputs of comparator 410 as shown in FIG. 4 may be opened and closed periodically corresponding to the desired clock signal.

A such generated digital signal may in particular indicate a polarity of ripples present in the signal output at the bandgap output.

The digital signal output by analog to digital converter arrangement 47 is output to a state machine 414 of a control arrangement 412. State machine 414 may analyze the signal and forward the signal to a digital integrator 413, which may be implemented using a shift register. Digital integrator 413 in conjunction with state machine 414 integrates the digital signal output by analog to digital converter arrangement 47 and controls a voltage offset of amplifier 45 of chopper amplifier arrangement 43 based on the integrated signal. For example, the digital signal output by analog to digital converter arrangement 47 may represent a polarity of ripples, and in response to the polarity a control signal output by digital integrator 413 may increased or decreased in order to reduce, minimize or even eliminate the ripples.

State machine 414 may be controlled by a control signal ctrl and, besides modifying a shift register of digital integrator 413 such that digital integrator 413 integrates the signal, may also control clock signal clk for example to temporarily deactivate the chopping (modulation/demodulation) when the digital signal output by analog to digital converter arrangement 47 indicates that only negligible ripples, for example ripples below a certain threshold, occur, or otherwise a steady state has been reached. A steady state may for example be indicated by the signal output by analog to digital converter arrangement 47 indicating an average polarity of approximately zero (i.e. approximately equal numbers of positive and negative polarities) over a predetermined averaging time. In such a case, additionally or alternatively state machine 414 may deactivate analog to digital converter arrangement 47 and control digital integrator 413 to keep its output signal constant. After a predetermined period of time, the chopping and/or analog to digital converter arrangement 47 may be reactivated.

It should be noted that while in FIG. 4 a 1-bit analog to digital converter arrangement 47 based on a comparator is shown, in other embodiments also other kinds of analog to digital converters quantifying ripples in a signal may be used, for example analog to digital converters using more than one bit as an output, e.g. as already mentioned with respect to FIG. 1.

Furthermore, in some embodiments, the possibility for deactivation of the clock signal for modulator 44 and demodulator 46 and/or the deactivation of analog to digital converter arrangement 47 may be omitted. In this case, in some embodiments no state machine 414 or a modified state machine may be provided. State machine 414 in some embodiments may be an analog state machine.

It should be noted that state machine 414 and/or digital integrator 413 may be operable in different modes of operation, for example depending on a state of the apparatus of FIG. 4. For example when starting the system, after a supply voltage change or after a power-down state, a different algorithm may be used than in steady state. For example, for a predetermined time period after the above-mentioned event like a system start, a successive approximation approach may be used to quickly reduce ripples, and later on a tracking approach may be used to track changes of the ripples.

Figure 5:
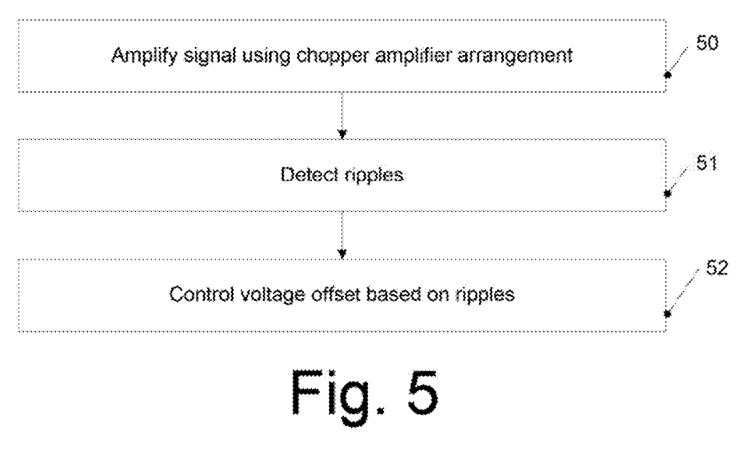
FIG. 5 is a flowchart illustrating a method according to an embodiment.
Figure 6:
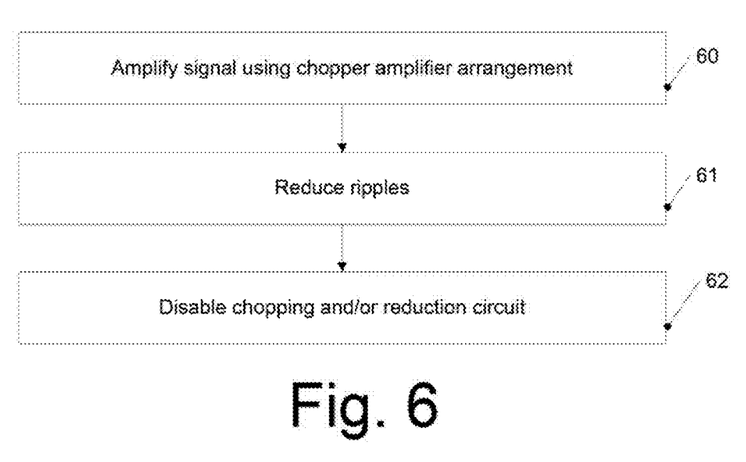
FIG. 6 is a flowchart illustrating a method according to an embodiment.

In FIGS. 5 and 6, flowcharts illustrating methods according to various embodiments are illustrated. While the methods will be described as series of acts or events, the described order of such acts or events is not to be construed as limiting. In particular, various acts or events described may be performed in a different order than shown, and/or acts or events may be performed concurrently with each other.

The methods of FIGS. 5 and 6 may be combined with each other, but may also be used separately. The methods of FIGS. 5 and 6 may be implemented in the apparatuses described with respect to FIG. 1-4, but may also be implemented independently of these devices.

Turning now to FIG. 5, at 50 a signal is amplified using a chopper amplifier arrangement.

At 51, ripples are detected in a signal caused by the chopper amplifier arrangement, for example by evaluating an output signal of the chopper amplifier or any other signal in which ripples are caused by the chopper amplifier arrangement.

At 52, a voltage offset of an amplifier of the chopper amplifier arrangement is controlled, for example adjusted, based on the detected ripples. For example, a digital signal indicating the ripples may be integrated, and the integrated signal may be used as a control signal for the amplifier.

Turning to FIG. 6, at 60 a signal is amplified using a chopper amplifier. At 61, ripples caused by using the chopper amplifier arrangement are reduced, for example by controlling a voltage offset of an amplifier of the chopper amplifier arrangement. At 62, a chopping (modulation, demodulation) of the chopper amplifier arrangement and/or at least part of a reduction circuit used to reduce the ripples at 61, for example an analog to digital converter, is/are at least temporarily deactivated. After a predetermined time, these elements may be reactivated.

Figure 7:
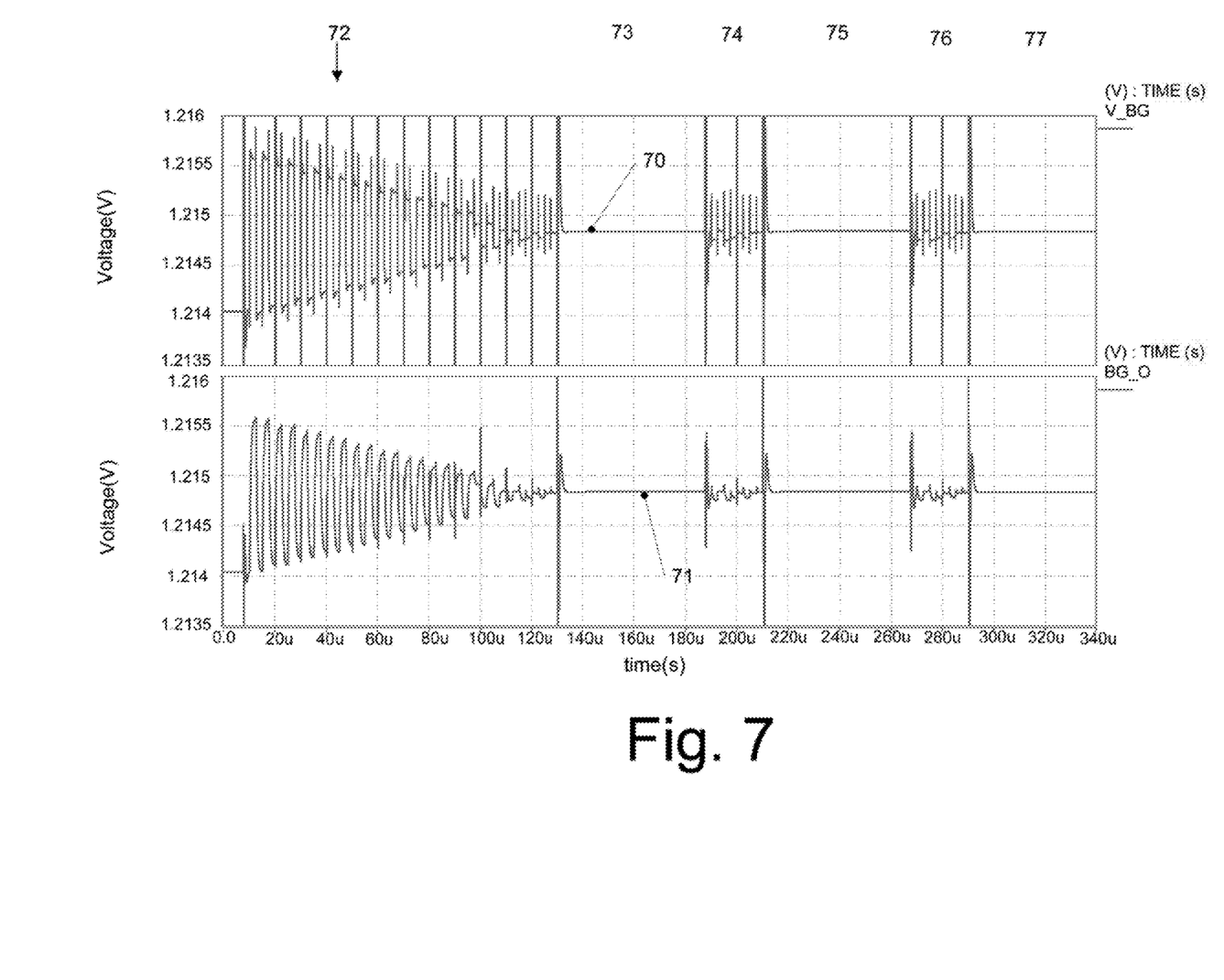
FIG. 7 shows simulation results illustrating some features of some embodiments.

In FIG. 7, simulation results are shown illustrating some features of some embodiments. These simulation results relate to a particular implementation, somewhat similar to the implementation of FIG. 4, and are not to be construed as limiting, but are merely given for illustration purposes to better understand effects achievable by the use of some embodiments.

A curve 70 shows a case where no lowpass filter is used. A curve 70 in particular illustrates a behavior of a bandgap voltage generated by an apparatus like the apparatus of FIG. 4.

In a region 72, ripples are gradually reduced by adjusting a voltage offset of an amplifier used. When the ripples are sufficiently reduced, in a region 73 chopping is turned off. After some time, in a region 74, chopping and ripple reduction is switched on again, to reduce ripples which have reappeared in the meantime for example due to temperature variations, e.g. drift or other drift phenomena. In a region 75, again chopping and ripple reduction is switched off, in a region 76 switched on again, in a region 77 switched off again etc. A time duration for switching off, i.e. a duration of region 73, 75 or 77 may be in the order of some seconds, for example about 10 seconds. However, shorter or longer time periods are equally possible.

When the ripples have been reduced sufficiently, in some embodiments this implies that an offset voltage of an amplifier used in a chopper amplifier arrangement has been reduced correspondingly.

During time periods 73, 75 and 77 the bandgap voltage does not exhibit ripples. However, due to the turning off of the chopping, 1/f noise may increase. In other embodiments, only a ripple reduction circuitry or part thereof, for example an analog to digital converter, may be disabled temporarily, leading to a power saving.

The ripples at the start of period 72 are determined by an inherent offset voltage of the amplifier before any ripple reduction is performed.

Some embodiments of the application allow to easily adjust the chopper frequency for different applications without stability problems. As already mentioned, by modifying the chopper frequency flicker noise in the system may be optimized, or the chopping may be adapted to different operation modes of the operation (for example optimizing residual voltage offset, optimizing ripple or optimized flicker noise).

A curve 71 in FIG. 7 shows the time behavior of the system similar to curve 70 for a case where additionally a lowpass filter is provided, as for example indicated in FIG. 1. In this case, the ripples are reduced compared to the case of curve 70.

The above-described embodiments, as already emphasized, are merely examples, and other implementations are possible as clear to persons skilled in the art upon reading the present disclosure. Such variations or modifications are intended to be covered by the scope of the present application.

What is claimed is:

1. An apparatus, comprising:
a chopper amplifier arrangement comprising a modulator, an amplifier and a demodulator,
a ripple detector to detect ripples caused by said chopper amplifier arrangement and to adjust a voltage offset of said amplifier based on the detected ripples, and
a system having an output, said output of said system being coupled with an input of said modulator, wherein an output of said demodulator is coupled with a control terminal of said system.

2. The apparatus of claim 1, wherein said ripple detector is to detect ripples by evaluating one or more signals of an output signal of said chopper amplifier arrangement, a signal influenced by said output signal of said chopper amplifier arrangement or a signal within said chopper amplifier arrangement.

3. The apparatus of claim 2, wherein said ripple detector comprises an analog to digital converter to convert said one or more signals to a digital signal, and an integrator coupled to said analog to digital converter to integrate said digital signal.

4. The apparatus of claim 3, wherein said analog to digital converter comprises a 1-bit analog to digital converter.

5. The apparatus of claim 3, wherein said analog to digital converter comprises a comparator.

6. The apparatus of claim 5, wherein said comparator comprises one or more of an Auto-zero comparator or a correlated double-sampling comparator.

7. The apparatus of claim 1, wherein said ripple detector is to detect a polarity of ripples.

8. The apparatus of claim 1, further comprising a control to temporarily disable at least one of said modulator, said demodulator or at least part of said ripple detector.

9. An apparatus, comprising:
a modulator,
an amplifier downstream to said modulator,
a demodulator downstream of said amplifier,
an analog to digital converter coupled to a node of the apparatus,
an integrator coupled to an output of said analog to digital converter, and
a state machine coupled between said analog to digital converter and said integrator, a control output of said state machine controlling a clock signal supplied to said modulator and said demodulator,
wherein an output of said integrator is coupled to an offset voltage control terminal of said amplifier.

10. The apparatus of claim 9, wherein said analog to digital converter comprises a comparator.

11. The apparatus of claim 9, wherein said node is coupled with an output of said demodulator.

12. The apparatus of claim 9, further comprising a system having an output, said output of said system being coupled with an input of said modulator, wherein an output of said demodulator is coupled with a control terminal of said system, and wherein
said node is a node of said system.

13. The apparatus of claim 9, wherein said integrator comprises one or more of an up/down-counter or an adaptive integrator.

14. A method, comprising:
amplifying a signal using an amplifier arrangement,
detecting ripples caused by said amplifier arrangement;
controlling a voltage offset of an amplifier of said amplifier arrangement based on the detected ripples; and
temporarily disabling one or more of a chopping of said chopper amplifier and said detecting ripples.

15. The method of claim 14, wherein said detecting ripples comprises digitizing a signal influenced by said amplifier arrangement to have ripples, and integrating the digitized signal.

16. The method of claim 14, further comprising changing a mode of operation of said detecting ripples.

17. The method of claim 14, wherein said amplifier arrangement is a chopper amplifier arrangement.

18. The method of claim 14, wherein said amplifying a signal comprises amplifying a signal generated by a bandgap circuit.

19. A method, comprising:
amplifying a signal using an amplifier arrangement,
reducing ripples caused by said amplifier arrangement, and
at least temporarily disabling a chopping of said amplifier arrangement after the reducing ripples caused by said amplifier arrangement.

20. The method of claim 19, further comprising reactivating said chopping after said temporarily disabling.

21. The method of claim 14, wherein the detecting ripples caused by said amplifier arrangement includes determining a polarity of one or more detected ripples.

22. The method of claim 21, wherein the determining the polarity of the detected ripples includes counting up when the one or more detected ripples has a positive polarity and/or counting down when the one or more detected ripples has a negative polarity.

23. The method of claim 19, further comprising detecting ripples caused by said amplifier arrangement and determining a polarity of one or more detected ripples.

24. The method of claim 23, wherein the determining the polarity of the detected ripples includes counting up when the one or more detected ripples has a positive polarity and/or counting down when the one or more detected ripples has a negative polarity.

* * * * *